United States Patent [19]
Endroes et al.

[11] Patent Number: 5,340,410
[45] Date of Patent: Aug. 23, 1994

[54] METHOD FOR MANUFACTURING POLYCRYSTALLINE SILICON THIN-FILM SOLAR CELLS

[75] Inventors: Arthur Endroes, Munich; Wolfgang Kruehler, Unterhaching; Richard Einzinger, Steinhoering; Rolf Plaettner, Riemerling, all of Fed. Rep. of Germany

[73] Assignees: Siemens Aktiengesellschaft; Siemens Solar GmbH, both of Munich, Fed. Rep. of Germany

[21] Appl. No.: 970,836

[22] Filed: Nov. 3, 1992

[30] Foreign Application Priority Data

Nov. 8, 1991 [DE] Fed. Rep. of Germany ....... 4136815

[51] Int. Cl.$^5$ ............. H01L 31/0392; H01L 31/0368; H01L 31/18
[52] U.S. Cl. ...................... 136/258; 437/4; 437/109; 437/967
[58] Field of Search ............ 437/4, 109, 967; 136/258 PC

[56] References Cited

U.S. PATENT DOCUMENTS

| | | | |
|---|---|---|---|
| 4,137,123 | 1/1979 | Bailey et al. | 156/647 |
| 4,772,564 | 9/1988 | Barnett et al. | 437/4 |
| 5,053,355 | 10/1991 | von Campe | 437/114 |
| 5,094,697 | 3/1992 | Takabayashi et al. | 136/249 |
| 5,098,850 | 3/1992 | Nishida et al. | 437/4 |
| 5,246,886 | 9/1993 | Sakai et al. | 437/228 |

FOREIGN PATENT DOCUMENTS

| | | |
|---|---|---|
| 0260955 | 9/1987 | European Pat. Off. . |
| 0334110 | 3/1989 | European Pat. Off. . |
| JP-A-11 10 776 | 4/1989 | Japan ............ 136/258 PC |
| JP-A-30 46 339 | 2/1991 | Japan ............ 136/258 PC |

OTHER PUBLICATIONS

Hasegawa et al., *Structural and Electrical Properties of P- and B-Doped Polycrystalline Silicon by Plasma-Enhanced CVD at 700 C*, Japanese Journal of Applied Physics, vol. 28, No. 4, Apr., 1989, pp. L522–L524.

Kerber et al., *Large Grain Polycrystalline Silicon Films on Graphite for Solar Cell Application*, Seventeenth IEEE Photovoltaic Specialists Conference, vol. 1, pp. 275–280 (May 1984).

*Primary Examiner*—Aaron Weistuch
*Attorney, Agent, or Firm*—Hill, Steadman & Simpson

[57] ABSTRACT

The present invention provides an improved method for manufacturing highly efficient and especially thin polycrystalline silicon thin-film solar cells. More particularly, the present invention provides a silicon nucleation layer produced on amorphous substrates with a nucleation layer being selectively etched until uniformly <111> orientated nuclei remain. A silicon thin-film grown thereover is coarse-crystalline, has grain boundaries residing perpendicular to the substrate and has a pyramid structure as a consequence of the uniform orientation. High photocurrents can already be achieved with solar cells manufactured therefrom beginning with a layer thickness of 10 μm.

9 Claims, 2 Drawing Sheets

METHOD FOR MANUFACTURING POLYCRYSTALLINE SILICON THIN-FILM SOLAR CELLS

BACKGROUND OF THE INVENTION

The present invention relates to polycrystalline silicon thin-film solar cells. Particularly, the present invention relates to an improved method for manufacturing polycrystalline thin-film solar cells which can be manufactured on an amorphous substrate. Further, the present invention relates to a highly efficient, cost-beneficial, large-area solar cell.

A broadly applied terrestrial employment of photovoltaic systems for power applications requires that highly efficient, economically manufacturable, large area solar cells with long-term stability and made of environmentally safe materials exist. At present, no solar cells that simultaneously meet these demands exist.

Thin-film solar cells of polycrystalline silicon can be manufactured with cost-beneficial deposition processes on inexpensive substrates. Polycrystalline silicon solar cells provide many advantages. For instance, such solar cells can be deposited on a large-area, have a relatively high efficiency, and require less material in comparison to crystalline solar cells. Further, polycrystalline silicon solar cells can be interconnected in integrated fashion to form modules, are environmentally safe, and have excellent long-term stability.

For example, polycrystalline thin-film solar cells of silicon can be fabricated of cast silicon that has solidified in polycrystalline fashion in blocks. The individual solar cells must then be sliced from the large blocks. This method is disadvantageous due to the high loss of material when slicing and the great thickness of the wafers required for the mechanical stability of the sliced wafers. The wafer thickness amounts to a multiple of the thickness required for complete absorption of the solar spectrum, resulting in a further unnecessary loss of material in addition to physical disadvantages.

Amorphous microcrystalline layers can be directly deposited on substrates in the required thickness with chemical vapor deposition ("CVD") and plasma deposition methods. Complicated recrystallization methods, such as lasers, convert these amorphous microcrystalline layers into more coarsely crystalline layers. The coarsely crystalline layers are required for a high efficiency of polycrystalline solar cells manufactured therefrom.

Crystalline and polycrystalline layers that can likewise be employed for solar cells can be grown on crystalline substrates with epitaxial methods. However, these methods employ an unusually expensive substrate, which impedes economical and broadly applied applications of these solar cells.

Inexpensive and therefore usually amorphous foreign substrates, for example, glasses, ceramics, metallic sheet metals, and others, are desirable for cost-beneficial polycrystalline solar cells. However, in the direct deposition of the solar cells onto the substrates, the high deposition temperatures of more than 1000° C. required for high efficiency, coarse-crystalline thin-film solar cells cause many problems. For instance, such high deposition temperatures considerably restrict the selection of substrates with respect to their temperature stability. In addition, problems of diffusion, adhesion, and chemical reaction occur at such high deposition temperatures.

SUMMARY OF THE INVENTION

The present invention provides an improved method for manufacturing polycrystalline thin-film solar cells of silicon. The solar cells of the present invention can be manufactured on amorphous substrates which leads to material-saving thin-film solar cells having high efficiency.

To this end, the invention provides a method for manufacturing polycrystalline solar cells. Initially, a polycrystalline silicon nucleation layer is produced on an electrically conductive substrate. The silicon nucleation layer contains silicon crystallites in <111> orientation. Next, the nucleation layer is selectively etched until only crystallites having <111> orientation remain as nuclei on the substrate. Steps 1 and 2 are repeated until an adequate nucleus density and nucleus size are achieved. Then, a polycrystalline silicon thin-film corresponding to the nucleus orientation is grown over the substrate provided with the nuclei. A pn-junction is then produced in the thin-film. Lastly, front side contacts are applied on the thin-film surface.

The present invention also provides a polycrystalline thin-film solar cell comprising a graphite substrate, an approximately 10 to 50 μm thick polycrystalline silicon thin film layer with <111> orientation of the crystallites lying thereabove, a pn junction in the thin-film, and a finger electrode structure as a front side contact on the surface of silicon thin-film. The silicon layer has a pyramid-like surface, whereas the crystallites have an average grain size of about 10 to 50 μm.

The present invention provides an improved method to manufacture a defined and reproducible nucleation of silicon on inexpensive substrates that are freely selectable at least in terms of their structure and are therefore amorphous. The substrates must be either electrically conductive, coated in electrically conductive fashion or provided with an electrically conductive structure. Suitable substrates are those that can withstand the high deposition temperatures of more than 1000° C. without damage. Polycrystalline silicon thin-films whose coarse-crystalline layer structure achieve grain sizes from approximately 40 to 50 μm can be produced on such substrates with the method of the present invention.

The type of deposition method for the polycrystalline silicon nucleation layer is not critical to the present invention, other than crystallites having <111> orientation must be contained in the produced nucleation layer. Since multiple repetitive deposition of the nucleation layer and selective etching set the required or, respectively, desired size and density of the crystallites, the number and size of these crystallites are uncritical.

Etch solutions and methods that were particularly utilized for texturing monocrystalline silicon surfaces are known for selective etching, since this process also requires a crystal-orientated etching. In the method of the present invention, nuclei having <111> orientation that have the lowest rate or, respectively, the lowest erosion rate vis-a-vis the specific etching remain after the etching. The crystal lites of the present invention need only be a few nanometers thick, since they can already serve as nuclei in the repeated production of a silicon nucleation layer and thereby increase in size.

An average spacing of the nuclei that at least corresponds to the layer thickness of the polycrystalline silicon thin-film is selected for the density of the nuclei on the substrate. This selection guarantees that grain boundaries proceeding perpendicularly with respect to the substrate predominately arise in the layer. The grain boundaries are necessary for a high-efficiency solar cell.

As soon as silicon nuclei that are adequate in number and size have arisen on the substrate, the nuclei are employed for growing a polycrystalline layer. The growing of a polycrystalline layer can ensue with standard methods known from epitaxy, for example by vapor phase or liquid phase deposition from the melt.

The <111> orientation of the nuclei is advantageous for several reasons. A polycrystalline layer grown according to this orientation comprises vertical grain boundaries and results in a roughened surface having pyramid-like elevations. The growth of the nuclei ensues most slowly in the <111> direction and more quickly in the lateral direction parallel to the substrate. Thus, a good and rapid surface coverage is achieved when growing a polycrystalline layer containing silicon crystallites in <111> orientation.

Known methods can be utilized to produce a pn-junction and front-side contacts. For example, phosphorous diffusion can be used to produce the pn-junction. A soak screening method using electrically conductive paste can be used to produce the front-side contacts.

In a preferred embodiment, the substrate material is graphite. The graphite has a high thermal and chemical resistance and also has the same co-efficient of expansion as silicon. It can be utilized in the form of wafers or foils and can directly serve as backside contact for the later solar cells as a result of its electrical conductivity. The formation of silicon nuclei directly on the graphite substrate solves the adhesion problems which derive due to the non-weatherability of graphite by silicon. Employing flexible graphite foils produces flexible solar cells.

A CVD method can be employed for generating the nucleation layer. A good wetting of the graphite with silicon is achieved with a deposition rate of up to 5 $\mu$m per minute at temperatures from about 1000° to 1200° C. Silane-hydrogen mixtures preferably serve as deposition gases. However, other silicon-containing gases and gas mixtures are also suitable, for example mixtures with chlorosilanes. Silicon crystallites having <111> orientation perpendicular to the substrate surface are predominately obtained with this method under the said conditions. Further possibilities of variation for influencing the orientation are established via the pressures that can lie in the Torr range up to atmospheric pressure. Excessively low pressures result in a low growth rate of the nucleation layer.

The selective etching rate is sensitively dependent on temperature and concentration of the etching solution. In an embodiment, the selective etching is implemented in aqueous potassium hydroxide solution. Preferably, a 20% aqueous potassium hydroxide solution is used at a temperature of 40° C. An etching rate of approximately 0.2 $\mu$m per minute for the non-<111>-orientated crystallites is thereby established. The <111> orientated silicon grains remain.

In a departure from wet-chemical etching, a plasma etching can alternatively be employed. To this end, the nucleation layer is advantageously generated in a reactor using a low-pressure CVD method (LPCVD) that can be simultaneously employed for plasma etching. Polysilicon is thereby repeatedly deposited in oriented fashion in alternation from the silane hydrogen mixture. Subsequently, the silicon layer is selectively etched with a $CCl_4O_2$ plasma, whereby silicon nuclei having privileged <111> orientation likewise arise. However, in this method, low growth and etching rates must be accepted.

The duration and/or intensity of the etching sets the density of the silicon nuclei on a substrate. A longer etching duration results in a diminished nucleus density. A nucleus density is advantageously set so that the average spacing between a nuclei amounts to about 1–5 times the thickness of the polycrystalline thin-film. Preferably, an optimum spacing is 50 $\mu$m. Traditional silicon solar cells having a smooth surface require a layer thickness of approximately 100 $\mu$m in order to completely absorb the sunlight. In contrast, the method of the present invention reduces the layer thickness of the polysilicon layer to approximately 10 $\mu$m. The self-arising pyramid-shaped texturing of the surface of the polycrystalline thin-film occurring as a result of the crystal orientation effects a light waveguide effect inside the thin-film. Both the incident as well as the reflected sunlight are conducted within the thin-film with the assistance of total reflection until it is absorbed.

The growth of the polycrystalline layer preferably ensues according to the liquid phase deposition method. With this method, the graphite substrates provided with the silicon nuclei are brought into contact with a metal melt saturated with silicon. The temperature for the method is selected between about 600 and 1000° C. Metals suitable for this purpose are, for example, tin, indium, antimony, bismuth or mixtures of several of these metals. Insofar as the silicon dissolved in the metal melt is not already p-doped, additional, slight amounts of boron are added thereto, these being incorporated into the growing silicon layer and rendering it slightly p-conductive (approximately 1 Ohm/cm). The deposition rates under the said conditions lie between 0.4 and 4 $\mu$m per minute, so that a desired layer thickness is achieved in a few minutes. The desired layer thickness is selected between 10 and 50 $\mu$m, preferably between 10 and 30/$\mu$m. The selected range is adequate for high photocurrents in the later formed solar cell. During the growth of the polycrystalline thin-film, the pyramid-like structure already prescribed in the nuclei is propagated during the entire growth and thus automatically leads to a layer surface of the thin-film having pyramid-like roughness. The desired light trap geometry is thus created, thereby lengthening incident light rays within the thin-film due to angled multiple reflection and leading to total absorption.

The grain sizes of the monocrystalline regions of the thin-film ideally achieve the prescribed spacing of the nuclei on the substrate and therefore amount to about 50 $\mu$m. The diffusion length of the minority charge carriers required for high efficiency solar cells is thus achieved.

Thus, the method of the present invention provides the manufacturing of a coarse-crystalline polycrystalline silicon thin-film on inexpensive and conductive carbon substrate in a short time. The present invention also allows further processing to form high-efficiency thin-film solar cells. The deposition method for the nucleation layer as well as the growth method for the silicon thin-film are both suitable for coating large area substrates. Therefore, these methods make a comparatively cost-beneficial manufacture of solar cells possible.

Further processing into a functional thin-film solar cell ensues according to known steps. Initially, a pn-junction is produced in the thin-film, for example by phosphorus diffusion. In a conventional phosphorus diffusion system, the phosphorus diffuses 0.2 to 0.3/μm deep into the surface of the thin-film at approximately 850° C. and produces the junction thereat.

Alternatively, a further n-conductive layer can be grown onto the previously produced thin-film from a second metal melt, this containing phosphorus as doping element.

The application of a metallic finger-contact to the front side of the solar cell follows as a final step. A conventional silk screening method and a printing paste containing metallic particles are suitable for this purpose.

In addition, an antireflection layer can be applied over the front side contacts in order to better exploit the solar spectrum by further prevention of reflection losses or, respectively, to better absorb it in the thin film.

The invention will now be set forth in greater detail with reference to six figures.

DETAILED DESCRIPTION OF THE PRESENTLY PREFERRED EMBODIMENTS

Figure 1:
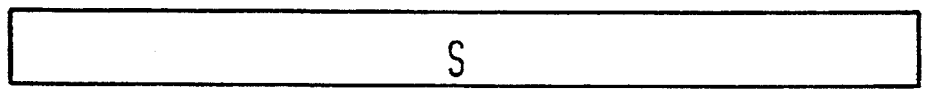
FIGS. 1 to 5 schematically illustrate the steps in the manufacture of a polycrystalline thin-film solar cell pursuant to the present invention.

FIG. 1 illustrates substrate S of the present invention. In one embodiment, substrate S is a conductive graphite foil. In another embodiment, substrate S is a conductive graphite wafer.

Figure 2:
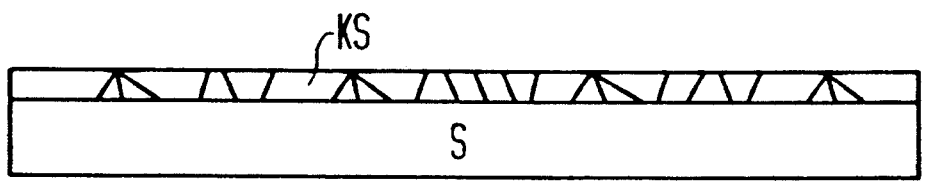

FIG. 2 illustrates a nucleation layer KS deposited on substrate S. After one-time deposition, the polycrystalline silicon nucleation layer KS is usually nanocrystalline. In addition to crystallites having <111> orientation, the nucleation layer KS contains further embryos having an arbitrary, other orientation. The nucleation layer KS is usually deposited only in a thickness that corresponds to the maximum diameter of the embryos.

By selective etching, for example, with aqueous potassium hydroxide solution or with plasma etching, all crystallites that do not have <111> orientation are etched out of the nucleation layer KS. In one embodiment, a 20% potassium hydroxide solution is used at a temperature of 40° C. In one embodiment, a $CCl_4/O_2$ plasma etching is utilized.

Figure 3:
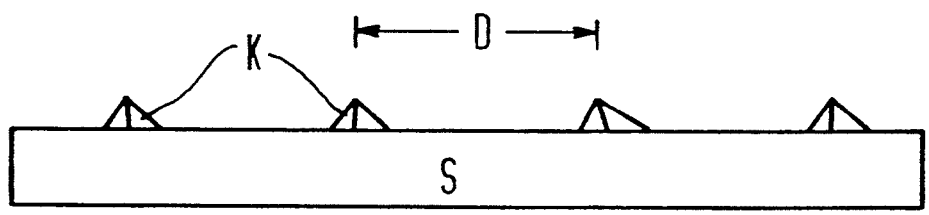

FIG. 3 illustrates the substrate S with remaining nuclei K having <111> orientation that have an average spacing D from one another. Insofar as the spacing amounts to less than the desired grain size in the thin-film, the etching process is continued until only that many nuclei K remain as corresponds to the desired nucleus density or, respectively, to the average spacing from nucleus to nucleus resulting therefrom. An average nucleus spacing D of approximately 50 μm is optimum. By renewed deposition of a further nucleation layer KS on the substrate S already provided with nuclei K, the already existing nuclei K enjoy privileged growth. After repeated, selective etching, enlarged nuclei K in the desired density are obtained. As a result of the <111> orientation, the nuclei K have a pyramid-like shape with upwardly directed apex.

Figure 4:
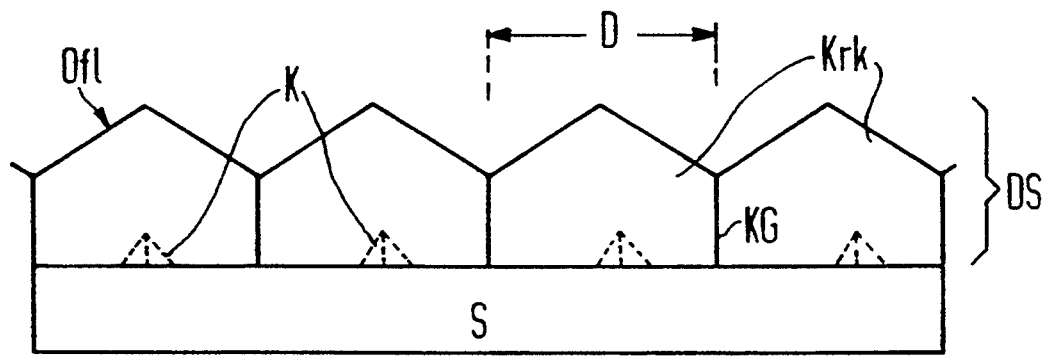

As illustrated in FIG. 4, a polycrystalline thin-film DS can be grown over the nuclei K from a silicon-saturated metal melt (for example, tin/800 through 1000 ° C.) that is brought into contact with the nuclei K. Crystal grains KrK having an average diameter that corresponds to the average nucleus spacing D result. The grain boundaries are oriented perpendicular vis-a-vis the substrate and do not represent recombination centers for those charge centers generated in the later formed solar cell on their way to the electrical contacts. The crystal orientation of the thin-film DS corresponds to the <111> orientation of the nuclei K. The surface Ofl of the thin-film DS is likewise a pyramid-shaped structure.

Figure 5:
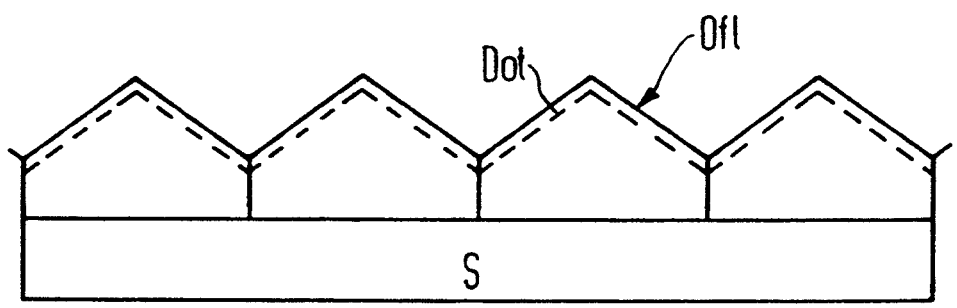

As illustrated in FIG. 5, the use of phosphorous diffusion across the surface Ofl of the slightly p-conductive thin-field DS produces an n-doping Dot and, thus, a pn-junction in a surface-proximate region.

Figure 6:
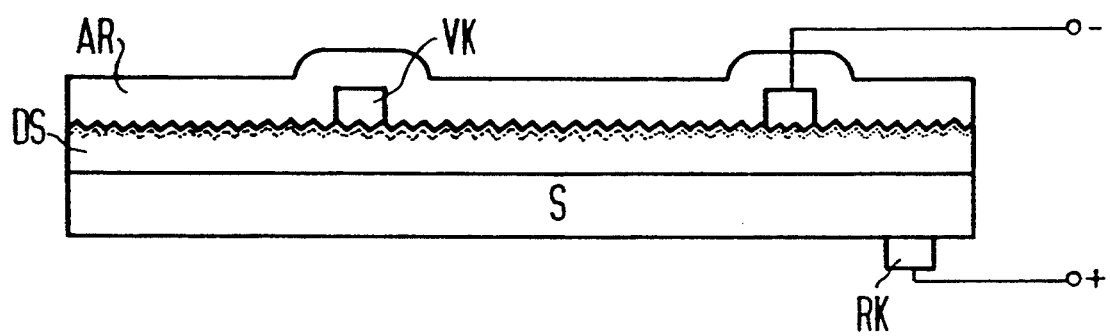
FIG. 6 illustrates a polycystalline thin-film solar cell of the present invention.

FIG. 6 illustrates a polycrystalline thin-film solar cell of the present invention. Finger-shaped electrode structures as front side contacts VK are printed on the surface Ofl of the thin-film DS by silk screening with, for example, a paste containing silver particles. A lower electrode density acting as a back side contact RK can be printed on the already conductive substrate S. Further, an anti-reflection layer AR can optionally be applied over the front side contact VK to supplement what is already a fully functional solar cell.

For the first time, the present invention generates uniformly orientation nuclei on arbitrary amorphous substrates. Likewise, the present invention allows for a uniformly orientated polycrystalline thin-film to grow on arbitrary amorphous substrates. Therefore, deriving in a simple way as an advantageous result is a pyramid-shaped surface structure of the thin-film. Since the surface structure acts as a light trap, high photocurrents can be achieved in thin-film solar cells manufactured therefrom having layer thickness of about 10 to 30 μm. The low layer thickness of thin-film solar cells leads to a considerable saving of silicon material in comparison to known polycrystalline thin-film solar cells. In addition to the simplified methodology, a considerable saving of silicon material leads to a reduction of cost. Additionally, a solar cell having few recombination centers can be produced on the basis of the beneficially arranged, vertical grain boundaries and the uniform crystal orientation. Moreover, this solar cell has a high efficiency as a consequence of the physically beneficial, low layer thickness.

Although other modifications and changes may be suggested by those skilled in the art, it is the intention of the inventors to embody within the patent warranted hereon all changes and modifications as reasonably and properly come within the scope of their contribution to the art.

We claim:

1. A method for manufacturing polycrystalline solar cells, comprising the steps of:
  (a) producing a polycrystalline silicon nucleation layer on an electrically conductive substrate, said silicon nucleation layer containing silicon crystallites in <111> orientation;
  (b) selectively etching the nucleation layer until only said crystallites having <111> orientation remain as nuclei on the substrate;
  (c) repeating steps (a) and (b) until a substrate having a selected nucleus density and nucleus size is obtained;
  (d) growing a polycrystalline silicon thin-film corresponding to the <111> nucleus orientation over the substrate obtained in step (c);
  producing a pn-junction in the thin-film; and applying electrical contacts on a front-side surface of said thin-film.

2. The method of claim 1 wherein step (a) is further defined by producing the polycrystalline silicon nucleation layer on an electrically conductive graphite substrate.

3. The method of claim 1 wherein step (a) is further defined by producing the nucleation layer from silane with a chemical vapor deposition method.

4. The method of claim 1 wherein step (b) is further defined by etching the nucleation layer with aqueous potassium hydroxide solution.

5. The method of claim 1 wherein step (d) is further defined by producing the thin-film in a thickness of about 10 to 50 µm with an average nucleus spacing of about 1 to 5 times the layer thickness.

6. The method of claim 1 wherein step (d) is further defined by producing the thin-film in a thickness of about 10 to 30 µm with an average nucleus spacing of about 1 to 5 times the layer thickness.

7. The method of claim 1 wherein step (d) is further defined by growing the polycrystalline silicon thin-film on the substrate provided with the nuclei according to the liquid phase deposition method from a silicon-saturated metal melt.

8. The method of claim 1 wherein step (a) is further defined by producing the nucleation layer with a low pressure chemical vapor deposition and step (b) of selectively etching the nucleation layer is further defined as plasma etching in the same reactor.

9. A polycrystalline thin-film cell comprising:
a graphite substrate,
an approximately 10 to 50 µm thick polycrystalline silicon thin-film layer with <111> orientation of the crystallites disposed on said substrate, the silicon thin-film layer having a pyramid like surface, the crystallites having an average grain size of about 10 to 50 micrometers,
a pn junction in the silicon thin-film layer, and
a finger electrode forming an electrical contact on a front-side surface of the silicon thin-film layer.

* * * * *